US009130197B2

(12) United States Patent
Kim

(10) Patent No.: US 9,130,197 B2
(45) Date of Patent: Sep. 8, 2015

(54) METHOD OF MANUFACTURING A CONDUCTIVE VIA IN AN ORGANIC LIGHT EMITTING DISPLAY

(71) Applicant: SAMSUNG DISPLAY CO., LTD., Yongin, Gyeonggi-Do (KR)

(72) Inventor: Sung Woong Kim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 18 days.

(21) Appl. No.: 13/960,699

(22) Filed: Aug. 6, 2013

(65) Prior Publication Data

US 2014/0315339 A1    Oct. 23, 2014

(30) Foreign Application Priority Data

Apr. 19, 2013  (KR) .................. 10-2013-0043784

(51) Int. Cl.
*H01L 51/56* (2006.01)
*H01L 51/52* (2006.01)
*H01L 51/00* (2006.01)

(52) U.S. Cl.
CPC ............ *H01L 51/56* (2013.01); *H01L 51/0017* (2013.01); *H01L 51/0021* (2013.01); *H01L 51/0022* (2013.01); *H01L 51/0023* (2013.01); *H01L 51/5221* (2013.01)

(58) Field of Classification Search
CPC ............ H01L 51/0021; H01L 51/0022; H01L 51/0023

USPC .................. 257/40, E51.022; 438/34
See application file for complete search history.

(56) References Cited

U.S. PATENT DOCUMENTS

| 6,768,258 B2 * | 7/2004 | Kobayashi ..................... 313/504 |
| 6,953,705 B2 * | 10/2005 | Prakash ......................... 438/99 |
| 2009/0215350 A1 | 8/2009 | Takei et al. |
| 2011/0241029 A1 | 10/2011 | An |

FOREIGN PATENT DOCUMENTS

| JP | 2009-231264 A | 10/2009 |
| KR | 10-2011-0112122 A | 10/2011 |

* cited by examiner

*Primary Examiner* — Mohammad Islam
*Assistant Examiner* — John P Dulka
(74) *Attorney, Agent, or Firm* — Christie, Parker & Hale, LLP

(57) ABSTRACT

A manufacturing method of an organic light emitting display includes preparing a substrate including a cathode line and forming an anode electrode on the substrate, the anode electrode being insulated from the cathode line. The method also includes forming an insulating layer having a first opening exposing a portion of the cathode line and a second opening exposing a portion of the anode electrode on the substrate, forming an organic layer on the insulating layer, and forming an electrical connection portion electrically connected to the cathode line. The electrical connection portion is formed in this method by supplying a conductive solution that dissolves the organic layer in an area of the organic layer corresponding to the first opening, and the manufacturing method also includes forming a cathode electrode overlapping with the electrical connection portion.

11 Claims, 9 Drawing Sheets

METHOD OF MANUFACTURING A CONDUCTIVE VIA IN AN ORGANIC LIGHT EMITTING DISPLAY

CROSS-REFERENCE TO RELATED APPLICATION

This patent application claims priority to and the benefit of Korean Patent Application No. 10-2013-0043784, filed on Apr. 19, 2013, the contents of which are hereby incorporated by reference in its entirety.

BACKGROUND

1. Field

Aspects of embodiments of the present invention relate to a method of manufacturing an organic light emitting display. More particularly, embodiments of the present invention relate to a method of manufacturing an organic light emitting display which is capable of preventing a voltage applied to a cathode electrode from dropping down.

2. Description of the Related Art

An organic light emitting display includes an anode electrode, a cathode electrode, and an organic material disposed between the anode electrode and the cathode electrode to display an image. Among display devices, the organic light emitting display has been spotlighted as a next generation display device because it has properties, e.g., fast response speed, wide viewing angle, etc.

The organic light emitting display is classified into a front surface light emitting type and a rear surface light emitting type. The front surface light emitting type organic light emitting display has an aperture ratio higher than that of the rear surface light emitting type organic light emitting display.

In general, because a light travels through the cathode electrode in the front surface light emitting type organic light emitting display, the cathode electrode is formed of a conductive material that is conductive and has transmissivity (e.g., is transparent). However, there are a limited number of materials that can be used as a low resistance cathode electrode using the conductive material that is also transparent.

Accordingly, a voltage drop, i.e., an "IR" drop, occurs in the cathode electrode and the voltage drop is intensified by the increase in size of the organic light emitting display.

In addition, a rear surface resonance structure is suggested to prevent or reduce deterioration of brightness due to the voltage drop of the cathode electrode, but such a structure imposes limits on the methods of manufacturing the organic light emitting display.

SUMMARY

Aspects of embodiments of the present invention provide a method of manufacturing an organic light emitting display which is capable of preventing a voltage drop from occurring in a voltage applied to a cathode electrode.

According to one embodiment of the present invention, a method of manufacturing an organic light emitting display including preparing a substrate including a cathode line, forming an anode electrode on the substrate, the anode electrode being insulated from the cathode line, forming a pixel definition layer having a first opening and a second opening on the substrate, the first opening exposing a portion of the cathode line and the second opening exposing a portion of the anode electrode, forming an organic layer on the pixel definition layer, forming an electrical connection portion electrically connected to the cathode line by supplying a conductive solution that dissolves the organic layer in an area of the organic layer corresponding to the first opening, and forming a cathode electrode on the organic layer, the cathode electrode being connected to the electrical connection portion.

The forming of the organic layer includes supplying a liquefied organic solution on the pixel definition layer and drying the liquefied organic solution.

The forming of the electrical connection portion includes supplying the conductive solution in the area of the organic layer corresponding to the first opening and drying a solvent in the conductive solution.

The conductive solution is supplied by a printing method or an inkjet method.

The conductive solution includes at least one of acetone, toluene, sodium hydroxide, potassium hydroxide, hydrogen fluoride, or phosphoric acid as the solvent thereof.

The conductive solution includes at least one of silver, copper, carbon nano-tube, or conductive polymer material as a solute thereof.

According to one embodiment of the present invention, a method of manufacturing an organic light emitting display including forming a cathode line on a substrate, forming an anode electrode on the substrate, the anode electrode being insulated from the cathode line, forming an insulating layer having a first opening exposing a portion of the cathode line and a second opening exposing a portion of the anode electrode, forming a first common layer on the portion of the anode electrode exposed by the second opening and the portion of the cathode line exposed by the first opening, forming an organic light emitting layer in an area of the first common layer corresponding to the second opening, forming a second common layer on the first common layer and the organic light emitting layer, forming an electrical connection portion electrically connected to the cathode line by supplying a conductive solution that dissolves the first common layer, and the second common layer to an area of the second common layer corresponding to the first opening, and forming a cathode electrode overlapping with the second common layer and the electrical connection portion.

The forming of the electrical connection portion includes supplying the conductive solution to the area of the second common layer corresponding to the first opening and drying a solvent contained in the conductive solution.

The conductive solution includes at least one of acetone, toluene, sodium hydroxide, potassium hydroxide, hydrogen fluoride, or phosphoric acid as a solvent thereof.

The conductive solution includes at least one of silver, copper, carbon nano-tube, or conductive polymer material as a solute thereof.

According to the above, the cathode line is disposed on the substrate and the contact hole is formed in a display area. The electrical connection portion is disposed in the electrical connection portion to electrically connect the cathode line to the cathode electrode, and thus the cathode voltage may be substantially uniformly applied to the whole surface of the display device. Therefore, the display device may prevent or reduce deterioration of brightness.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
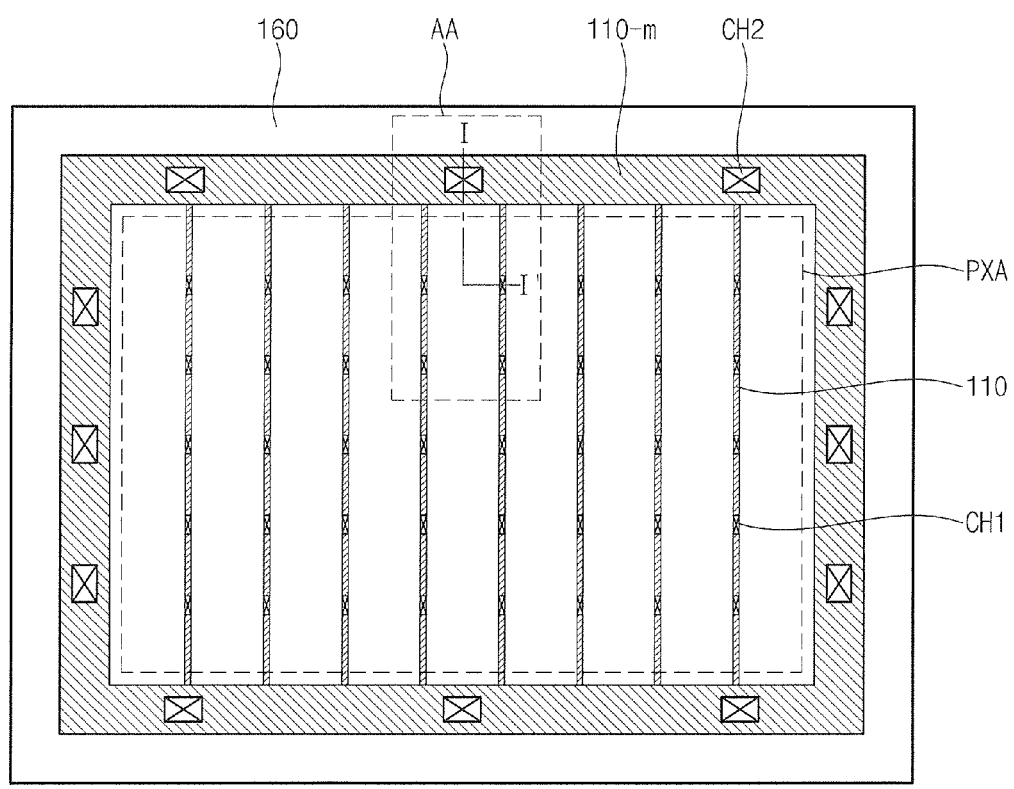
FIG. 1 is a plan view showing a display device manufactured by a method according to an exemplary embodiment of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in more detail with reference to the accompanying drawings.

FIG. 1 is a plan view showing a display device manufactured by a method according to an exemplary embodiment of the present disclosure.

Referring to FIG. 1, the display device includes a pixel area PXA, a main cathode line 110-$m$, and a cathode electrode 160 to cover (or covering) the pixel area PXA.

The pixel area PXA displays image information in response to electrical signals, and the image information is to be perceived to a viewer. The pixel area PXA includes various parts, e.g., an organic light emitting device, a transistor, a cathode line 110, and a first contact hole CH1.

As shown in FIG. 1, the cathode line 110 includes a plurality of cathode lines 110 in the pixel area PXA, and the cathode lines 110 are arranged in the pixel area PXA and spaced apart from each other at regular intervals along a direction (e.g., a predetermined direction).

The first contact hole CH1 is on (or disposed on) the cathode line 110 and the display device includes at least one first contact hole CH1. The first contact hole includes a plurality of contact holes that are arranged along the cathode line 110 and spaced apart from each other at regular intervals. The plurality of first contact holes are disposed uniformly or regularly across the pixel area PXA.

The main cathode line 110-$m$ is arranged in a peripheral area of the pixel area PXA, and thus the main cathode line 110-$m$ has a frame shape surrounding the pixel area PXA as shown in FIG. 1, but embodiments of the present invention are not limited thereto or thereby. For example, the main cathode line 110-$m$ may have a straight line shape adjacent to one side of the pixel area PXA.

As shown in FIG. 1, the cathode line 110 is on the same layer as the main cathode line 110-$m$. The cathode line 110 is integrally formed with the main cathode line 110-$m$.

In some embodiments, the cathode line 110 is be disposed on a different layer from the main cathode line 110-$m$. In this case, the cathode line 110 may be arranged to cross the main cathode line 110-$m$ with each on a different layer. The cathode line 110 and the main cathode line 110-$m$ may be electrically connected to each other through a contact hole.

The main cathode line 110-$m$ includes at least one second contact hole CH2. As shown in FIG. 1, the second contact holes CH2 are arranged on the main cathode line 110-$m$ to be spaced apart from each other at regular intervals.

The cathode electrode 160 and the main cathode line 110-$m$ are connected to each other through the second contact hole CH2. The main cathode line 110-$m$ applies a same voltage as the cathode electrode 160 to the peripheral area of the pixel area PXA through the second contact hole CH2.

Figure 2:
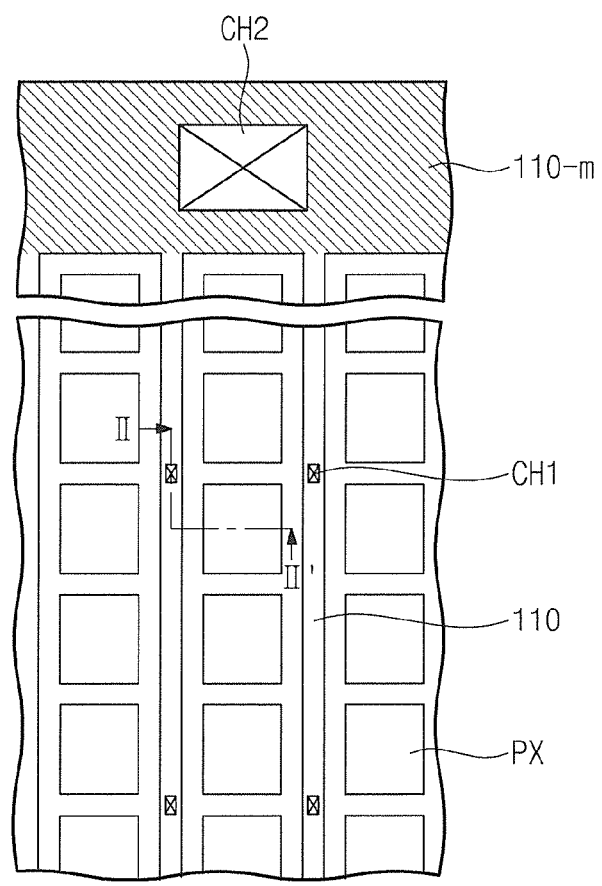
FIG. 2 is an enlarged plan view of a portion AA of FIG. 1.

FIG. 2 is an enlarged plan view of a portion AA of FIG. 1. In more detail, FIG. 2 shows an arrangement relation between the main cathode line 110-$m$, the cathode line 110, and the pixel (or pixels) PX. The pixel area (PXA) includes a plurality of pixels PX.

Referring to FIG. 2, the cathode line 110 branches from the main cathode line 110-$m$ toward a direction (e.g., a predetermined direction). The cathode line 110 is disposed in an area of the pixel area PXA in which the pixels PX are not formed.

Each of the cathode lines 110 includes one or more of the first contact holes CH1. The first contact holes CH1 are arranged along the cathode line 110 in the pixel area PXA and spaced apart from each other at a distance (e.g., a predetermined distance).

An electrical connection portion is disposed in the first contact hole CH1. The cathode electrode 160 (see, e.g., FIG. 1) and the cathode line 110 are electrically connected to each other by the electrical connection portion disposed in the first contact hole CH1.

The first contact hole CH1 serves as a pathway for substantially uniformly applying the voltage of the cathode electrode 160 to the pixel PX. The first contact holes CH1 are evenly distributed in the pixel area PXA to prevent the voltage of the cathode electrode 160 from dropping or for reducing the voltage drop of the cathode electrode 160.

The second contact holes CH2 are disposed on the main cathode line 110-m. The main cathode line 110-m is electrically connected to the cathode electrode 160 through the second contact holes CH2. Hereinafter, the display device manufactured by the method according to the present exemplary embodiment of the present disclosure will be described in more detail with reference to figures.

Figure 3:
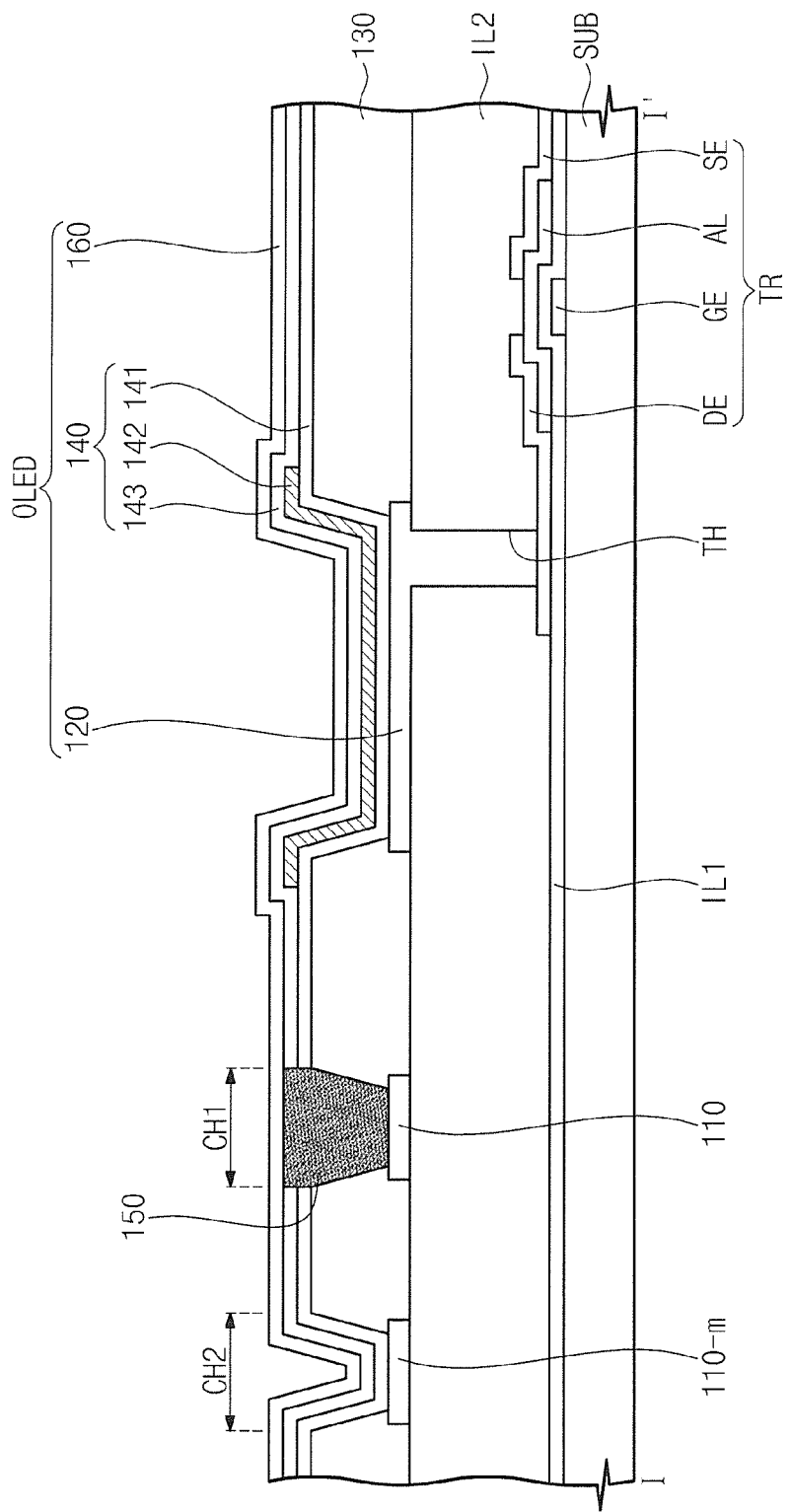
FIG. 3 is a cross-sectional view taken along a line I-I' of FIG. 1.

FIG. 3 is a cross-sectional view taken along a line I-I' of FIG. 1.

Referring to FIG. 3, an organic light emitting display includes the first contact hole CH1, the second contact hole CH2, the organic light emitting device OLED, and the transistor TR.

The transistor TR may be disposed on a different layer from the organic light emitting device OLED. The transistor TR is electrically connected to the organic light emitting device OLED.

As shown in FIG. 3, the transistor TR includes a base substrate SUB and a gate electrode GE disposed on the base substrate SUB. An upper portion of the gate electrode GE is covered by a first insulating layer IL1. The first insulating layer IL1 includes an organic layer and/or an inorganic layer.

The transistor TR includes a semiconductor layer AL disposed to be insulated from the gate electrode GE with the first insulating layer IL1 interposed therebetween. A source electrode SE and a drain electrode DE are disposed on a semiconductor layer AL to partially overlap with the semiconductor layer AL.

The source electrode SE and the drain electrode DE are disposed to be spaced apart from each other. The drain electrode DE is electrically connected to the organic light emitting device OLED. The transistor TR controls a light emission of the organic light emitting device OLED.

As shown in FIG. 3, the transistor TR is covered by a second insulating layer IL2. The second insulating layer IL2 serves as a planarization layer to planarize the upper portion of the transistor TR, and thus the organic light emitting device OLED may be disposed above the transistor TR covered by the second insulating layer IL2.

The second insulating layer IL2 includes at least one trench hole TH formed therethrough, and the organic light emitting device OLED is electrically connected to the transistor TR through the trench hole TH.

The organic light emitting device OLED, the main cathode line 110-m, and the cathode line 110 are disposed on the second insulating layer IL2. In addition, a driving line may be further disposed on the second insulating layer IL2.

In one embodiment, the main cathode line 110-m may be disposed on the substrate SUB, which is a different layer from that of the cathode line 110. In this case, the second insulating layer IL2 further has a through hole which connects the main cathode line 110-m to the cathode line 110.

The organic light emitting device OLED is disposed on the transistor TR with the second insulating layer IL2 interposed therebetween. The organic light emitting device OLED includes an anode electrode 120, an organic layer 140, and the cathode electrode 160.

The anode electrode 120 is disposed on the second insulating layer IL2 and electrically connected to the transistor TR. The anode electrode 120 is disposed to correspond to the pixel PX (see, e.g., FIG. 2).

As shown in FIG. 3, the transistor TR may control the light emission of the pixel PX (see, e.g., FIG. 2). The anode electrode 120 disposed in the pixel PX is electrically connected to the drain electrode DE of the transistor TR through the trench hole TH.

The anode electrode 120 is formed of a material with a high conductivity and a high work function. In more detail, the anode electrode 120 is formed of a transparent conductive oxide, e.g., indium tin oxide, indium zinc oxide, zinc oxide, indium oxide, etc.

An insulating layer 130 is disposed on the main cathode line 110-m, the cathode line 110, and the anode electrode 120. The insulating layer 130 includes one or more openings.

The openings correspond to the main cathode line 110-m, the cathode line 110, and the anode electrode 120, respectively. The insulating layer 130 covers edges of the anode electrode 120, the cathode line 110, and the main cathode line 110-m.

Some of the openings disposed on the main cathode line 110-m and the cathode line 110 define the first and second contact holes CH1 and CH2 (refer to FIG. 2). In addition, an opening disposed on the anode electrode and exposing the anode electrode may define a pixel.

For example, the insulating layer 130 may serve as the pixel definition layer having a thickness (e.g., a predetermined thickness) in the outside of the anode electrode 120. When the insulating layer 130 serves as the pixel definition layer, the insulating layer 130 defines each of the pixels.

In addition, the cathode line 110 and the anode electrode 120 are insulated from each other by the insulating layer 130. Accordingly, the insulating layer 130 may prevent or reduce the likelihood of the anode electrode 120 shorting to the cathode electrode 160.

The organic layer 140 is on the exposed anode electrode 120. The organic layer 140 includes a first common layer 141, an organic light emitting layer 142, and a second common layer 143. Each of the first common layer 141, the organic light emitting layer 142, and the second common layer 143 may have a single-layer structure or a multi-layer structure.

The first common layer 141 is on the anode electrode 120. The first common layer 141 injects and/or transports holes.

The organic light emitting layer 142 is disposed on the first common layer 141. The organic light emitting layer 142 generates a blue light, a green light, a red light, or a white light. The organic light emitting layer 142 may include a fluorescent material or a phosphor material.

The second common layer 143 is disposed between the organic light emitting layer 142 and the cathode electrode 160. The second common layer 143 injects and/or transports electrons.

The organic layer 140 may be formed of a low molecular organic material, e.g., copper phthalocyanine, tris-(8-hydroxyquinoline)aluminum, etc. In addition, the organic layer 140 may be formed of a high molecular organic material, e.g., PEDOT, PPV, polyfluorene-based material, etc.

The cathode electrode 160 makes contact with at least the electrical connection portion 150 and is disposed to face the anode electrode 120 with the organic layer 140 interposed therebetween. Further, the cathode electrode 160 may be formed to cover a whole surface of the display device manufactured by the method according to the present exemplary embodiment of the present disclosure.

The cathode electrode 160 is formed of a material with a work function lower than that of the anode electrode 120. For instance, the cathode electrode 160 may be a transmission electrode. In addition, the cathode electrode 160 may be a reflection electrode, e.g., Li, Ca, Lif/Ca, LiF/Al, Al, Ag, Mg, or a compound (or combination or alloy) thereof.

The cathode line 110 is disposed on the second insulating layer IL2 and spaced apart from the anode electrode 120. The insulating layer 130 is disposed on the cathode line 110 to cover the cathode line 110.

The main cathode line 110-m and the cathode line 110 are electrically insulated from the anode electrode 120 and electrically connected to the cathode electrode 160.

The first contact hole CH1 is formed through the insulating layer 130, the first common layer 141, and the second common layer 143 and disposed on the cathode line 110 to expose the cathode line 110, and the electrical connection portion 150 is disposed in the first contact hole CH1.

As shown in FIG. 3, the electrical connection portion 150 electrically contacts a portion of the cathode electrode 160. In more detail, the electrical connection portion 150 may be disposed in the area in which the voltage drop of the cathode electrode 160 occurs.

The electrical connection portion 150 includes a conductive material and is formed of the same material as the cathode electrode 160. The electrical connection portion 150 may be transparent or non-transparent (or opaque).

The electrical connection portion 150 serves as a contact electrode to electrically connect the cathode line 110 to the cathode electrode 160. A voltage provided from an external source device to the cathode line 110 is applied to the cathode electrode 160 through the electrical connection portion 150.

As described above, because the voltage is applied to the cathode electrode 160 through several areas and the display device includes the electrical connection portion 150, a voltage distribution may be substantially uniform over the entire area of the display device.

The main cathode line 110-m may be disposed on the same layer as the cathode line 110. In this case, the main cathode line 110-m is substantially connected (e.g., electrically connected) to the cathode line 110.

In one embodiment, the main cathode line 110-m may be disposed on a different layer from the cathode line 110. For example, the main cathode line 110-m may be disposed on the same layer as the source electrode SE and the drain electrode DE of the transistor TR, or on the same layer as the gate electrode GE of the transistor TR.

In the case that the main cathode line 110-m is disposed on the different layer from the cathode line 110, the display device may further include a third contact hole. The third contact hole may be formed through the second insulating layer IL2, and the cathode line 110 and the main cathode line 110-m may be electrically connected to each other through the third contact hole.

Figure 4:
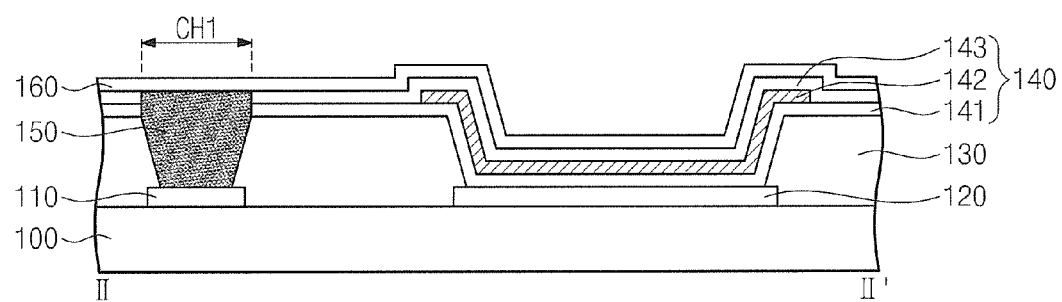
FIG. 4 is a cross-sectional view taken along a line II-II' of FIG. 2.

FIG. 4 is a cross-sectional view taken along a line II-II' of FIG. 2. In FIG. 4, the same reference numerals denote the same elements in FIG. 3, and thus detailed descriptions of the same elements will be omitted.

Referring to FIG. 4, the organic light emitting device OLED is disposed on the substrate 100. The substrate 100 may be the second insulating layer IL2, or, in another embodiment, the base substrate SUB which the transistor TR is disposed on.

In one embodiment, the substrate 100 may further include a protective layer formed thereon. The protective layer prevents or protects the substrate 100 from being contaminated. The protective layer protects the transistor and planarizes the area in which the organic light emitting device is located.

The substrate 100 may be formed of a transparent or a non-transparent (or opaque) material. For instance, the substrate 100 is formed of a transparent material in a rear surface light emitting type organic light emitting display or in a both surface light emitting type organic light emitting display.

In this case, the substrate 100 may be formed of a transparent glass material containing silicon oxide or a transparent plastic material. However, when the display device is a front surface light emitting type organic light emitting display, the substrate 100 may be formed of the non-transparent (or opaque) material, such as a metal.

FIGS. 5A, 5B, 5C, 5D, 5E, 5F, 5G, 5H, 5I, and 5J are views showing a method of manufacturing an organic light emitting display according to an exemplary embodiment of the present disclosure, which correspond to a cross-sectional view taken along the line II-II' of FIG. 2.

Figure 5A:
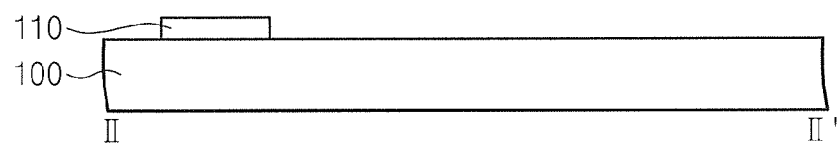
FIGS. 5A, 5B, 5C, 5D, 5E, 5F, 5G, 5H, 5I, and 5J are views showing a method of manufacturing an organic light emitting display according to an exemplary embodiment of the present disclosure.
Figure 5B:
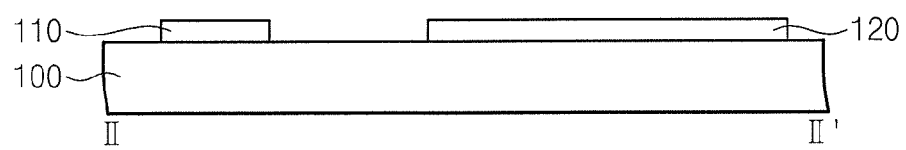

Referring to FIGS. 5A and 5B, the cathode line 110 and the anode electrode 120 are formed on the substrate 100. In one embodiment, the protective layer may be further formed on the substrate 100 before the cathode line 110 and the anode electrode 120 are formed.

In one embodiment, the substrate 100 may also include the transistor TR formed thereon. The transistor TR is formed on the substrate 100 through deposition, exposure, and development processes.

As shown in FIG. 5B, the anode electrode 120 is formed on the substrate 100. The anode electrode 120 is insulated or separated from the cathode line 110 and not formed in the area in which the cathode line 110 is formed.

The anode electrode 120 is disposed on the substrate 100 to be spaced apart from the cathode line 110. In addition, in one embodiment, the cathode line 100 may be disposed on a different layer from the anode electrode 120 with an insulating layer interposed therebetween. The anode electrode 120 may have a single-layer structure or a multi-layer structure.

The anode electrode 120 is formed by depositing a conductive material on the substrate 100 and patterning the conductive material using a photolithography process. The anode electrode 120 has a size corresponding to the pixel PX (see, e.g., FIG. 2).

In one embodiment, an insulating layer may be further formed on the substrate 100 to cover the cathode line 110 and the anode electrode 120. The insulating layer protects the cathode line 110 and the anode electrode 120 and planarizes the surface of the cathode line 110 and the anode electrode 120.

Figure 5C:
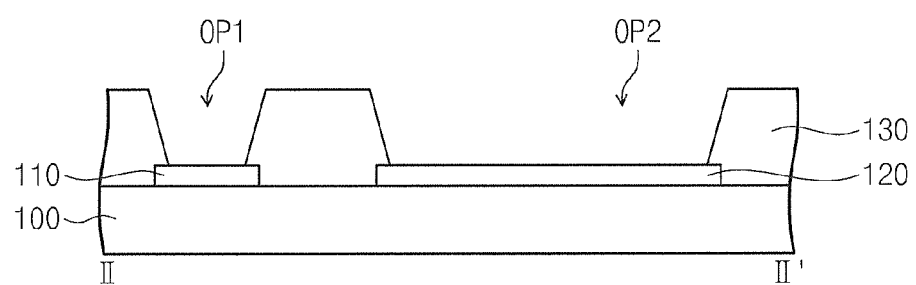

Referring to FIG. 5C, the insulating layer 130 is formed on the substrate 100. The insulating layer 130 includes the first and second openings OP1 and OP2 formed therethrough.

The first opening OP1 is formed through the insulating layer 130 and disposed on the cathode line 110 to expose a portion of the cathode line 110. The first opening OP1 corresponds to the first contact hole CH1 (see, e.g., FIG. 3).

As shown in FIG. 5C, the second opening OP2 is formed through the insulating layer 130 and disposed on the anode electrode 120 to expose the portion of the anode electrode 120. The insulating layer 130 covers the edge of the anode electrode 120 and serves as the pixel definition layer having a thickness (e.g., the predetermined thickness).

The second opening OP2 has a size greater than that of the first opening OP1. The first and second openings OP1 and OP2 are formed by patterning the insulating layer 130, e.g., an exposure process and a development process.

Figure 5D:
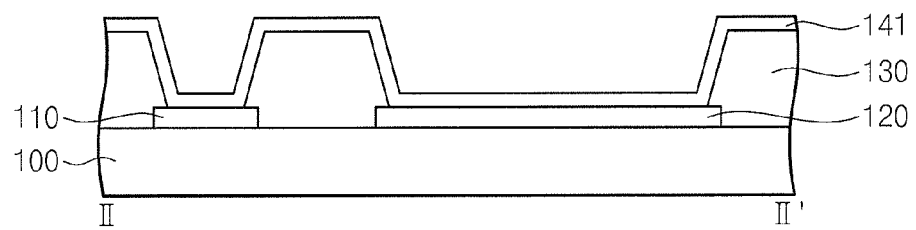
Figure 5E:
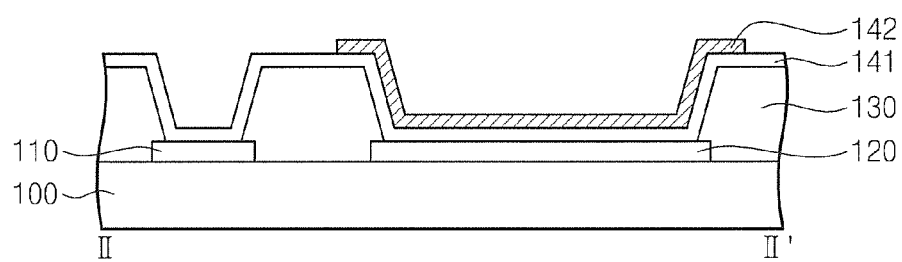
Figure 5F:
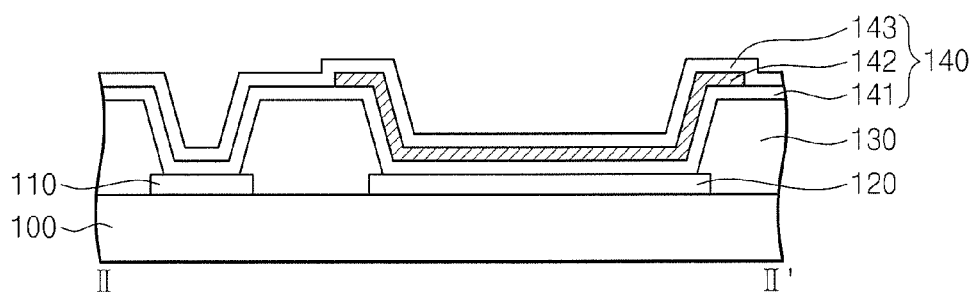

As shown in FIGS. 5D, 5E, and 5F, the organic layer 140 is formed on the insulating layer 130. The organic layer 140 includes the first common layer 141, the organic light emitting layer 142, and the second common layer 143.

Referring to FIG. 5D, the first common layer 141 is formed on the anode electrode 120. The first common layer 141 contacts the exposed portion of the cathode line 110 and the exposed portion of the anode electrode 120. The first common layer 141 may have the single-layer structure or the multi-layer structure of a hole injection layer and a hole transporting layer.

Referring to FIG. 5E, the organic light emitting layer 142 is formed on the first common layer 141 to correspond to the second opening OP2. The organic light emitting layer 142 has a size corresponding to that of the anode electrode 120. The size of the pixel may be determined by the organic light emitting layer 142.

Referring to FIG. 5F, the second common layer 143 is formed on the first common layer 141 and the organic light emitting layer 142. The second common layer 143 injects and/or transports the electrons.

Similar to the first common layer 141, the second common layer 143 may have the single-layer structure or the multi-layer structure of an electron injection layer and an electron transporting layer.

The organic layer 140 is formed to partially cover the cathode line 110. The organic layer 140 may be formed by a vacuum deposition method using an open mask or a fine metal mask.

In addition, the organic layer 140 may be formed by different methods, e.g., a printing method, an inkjet method, etc. Accordingly, the process of forming the organic layer 140 includes supplying a liquefied organic solution on the insulating layer 130 through which the first and second openings OP1 and OP2 are formed and drying the liquefied organic solution.

Figure 5G:
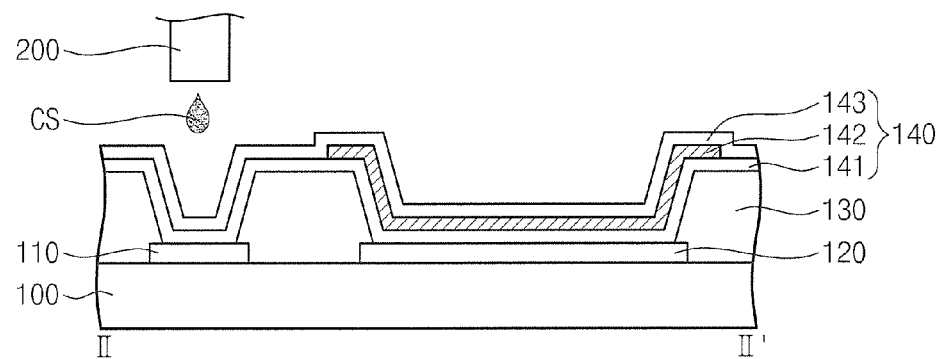
Figure 5H:
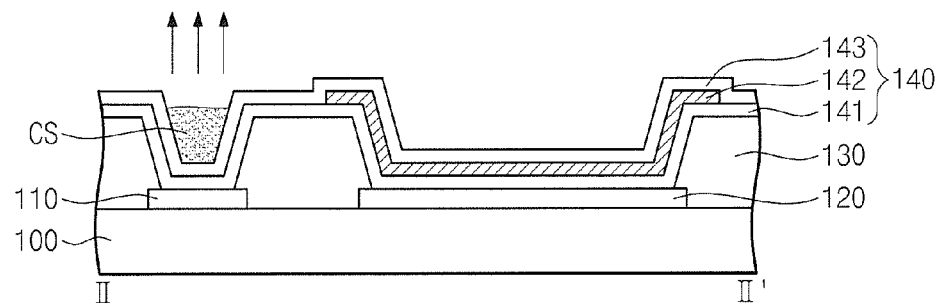
Figure 5I:
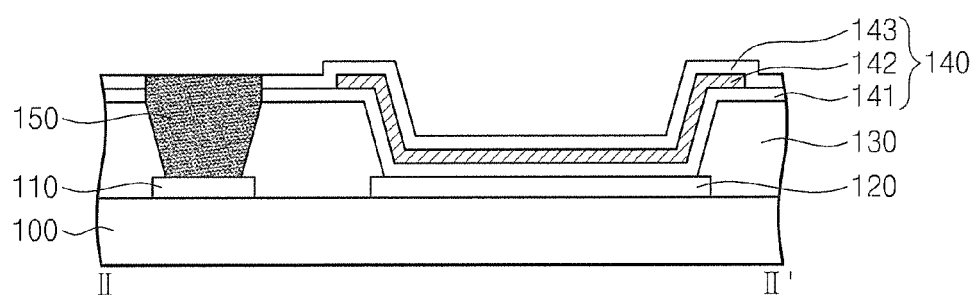

FIGS. 5G, 5H, and 5I show the process of forming the electrical connection portion 150. The process of forming the electrical connection portion 150 includes supplying a conductive solution CS, dissolving the organic layer 140, and drying the conductive solution CS.

Referring to FIG. 5G, the conductive solution CS is supplied to the area on the organic layer 140 which corresponds to the first opening OP1 using an ink provider 200. The conductive solution CS may be supplied in various methods, such as using a printing method or an inkjet printing method, etc.

The conductive solution CS includes a solute and a solvent. The solute of the conductive solution CS is a conductive material. In particular, because the conductive material is provided with the solvent in an ink type fluid, the conductive material is selected from inkable materials. Therefore, the solute of the conductive solution CS may include, for example, silver (Ag), copper (Cu), carbon nano-tube, or conductive polymer material.

The solvent of the conductive solution CS may be an organic solvent, such as acetone, toluene, etc., to dissolve the organic layer 140. In addition, the solvent of the conductive solution CS may be selected from alkaline solvents, such as sodium hydroxide, potassium hydroxide, etc., and acidic solvents, such as hydrogen fluoride, phosphoric acid, etc. The solvent of the conductive solution CS may be a single-component or multi-component solvent.

Referring to FIG. 5H, the conductive solution CS filled in the area of the organic layer 140 to correspond to the first opening OP1 dissolves the organic layer 140. The dissolved organic layer 140 is mixed with the conductive material in the conductive solution CS.

In one embodiment, the organic layer 140 corresponding to the first opening OP1 further includes the emitting layer 142. In this case, the conductive solution CS may dissolve all of the first common layer 141, the second common layer 143, and the organic emitting layer 142.

When a time (e.g., a predetermined time) lapses, the conductive solution in which the organic layer 140 is dissolved remains in the first contact hole CH1 partitioned by the insulating layer 130 and the cathode line 110. Thus, the conductive solution CS dissolves the organic layer 140 and makes contact with the cathode line 110.

Then, the conductive solution CS in which the organic layer 140 is dissolved is dried, and thus the solvent is removed from the conductive solution CS during the drying process.

Referring to FIG. 5I, the electrical connection portion 150 is formed in the first contact hole CH1 after the drying process is performed. The electrical connection portion 150 is formed by mixing the organic layer 140 with the solute of the conductive solution CS, i.e., the conductive material. The electrical connection portion 150 has a conductivity in accordance with a concentration of the conductive material, i.e., the solute of the conductive solution CS.

Figure 5J:
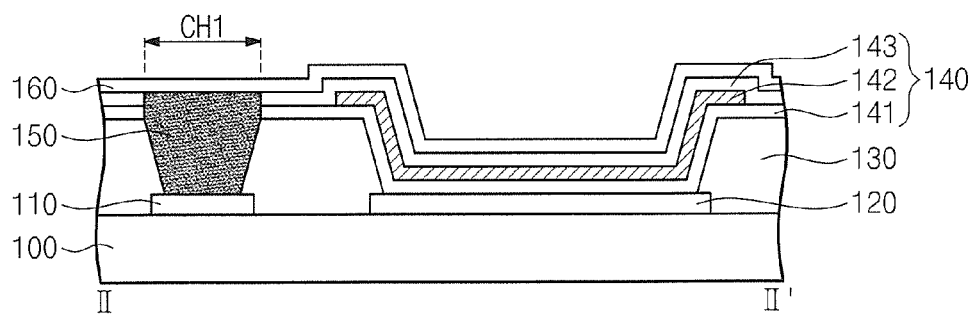

Referring to FIG. 5J, the cathode electrode 160 is formed on the organic layer 140 and the electrical connection portion 150. The cathode electrode 160 is disposed to face the anode electrode 120.

The cathode electrode 160 may be formed to cover the whole surface of the display device or at least the pixels and the first and second contact holes CH1 and CH2.

Positions of the cathode electrode 160 and the anode electrode 120 may be changed with respect to each other. The cathode electrode 160 may be formed by a chemical vapor deposition method or a sputtering method, but embodiments of the present invention are not limited thereto or thereby.

The cathode electrode 160 may have a substantially uniform voltage distribution over the whole surface of the display device by the first contact hole CH1 and the electrical connection portion 150. Thus, although the cathode electrode 160 is formed of the conductive material having permeability (or transmissivity or transparency), the voltage may be prevented from dropping (or the voltage drop may be reduced) in the cathode electrode 160.

In addition, the electrical connection portion 150 and the organic layer 140 may be formed using the printing method or the inkjet method. Thus, the display device may prevent or reduce deterioration of brightness uniformly even though the display device does not employ a rear surface resonance structure.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed and equivalents thereof.

What is claimed is:

1. A method of manufacturing an organic light emitting display, comprising:

preparing a substrate including a cathode line;

forming a plurality of anode electrodes on the substrate, the anode electrodes being insulated from the cathode line;

forming a pixel definition layer having a first opening and a plurality of second openings on the substrate, the first opening exposing a portion of the cathode line and each of the second openings exposing a portion of a corresponding one of the anode electrodes, the pixel definition layer covering a portion of the cathode line, and the second openings being arranged in a matrix shape along a plan view of the organic light emitting display;

forming an organic layer on the pixel definition layer, the organic layer overlapping the first opening and the second openings;

forming an electrical connection portion electrically connected to the cathode line by supplying a conductive solution that dissolves the organic layer in an area of the organic layer corresponding to the first opening; and forming a cathode electrode on the organic layer, the cathode electrode being electrically connected to the electrical connection portion.

2. The method of claim 1, wherein the forming of the organic layer comprises:

supplying a liquefied organic solution on the pixel definition layer; and drying the liquefied organic solution.

3. The method of claim 1, wherein the forming of the electrical connection portion comprises:

supplying the conductive solution in the area of the organic layer corresponding to the first opening; and drying a solvent contained in the conductive solution.

4. The method of claim 3, wherein the conductive solution is supplied by a printing method or an inkjet method.

5. The method of claim 3, wherein the conductive solution comprises at least one of acetone, toluene, sodium hydroxide, potassium hydroxide, hydrogen fluoride, or phosphoric acid as the solvent thereof.

6. The method of claim 3, wherein the conductive solution comprises at least one of silver, copper, carbon nano-tube, or conductive polymer material as a solute thereof.

7. A method of manufacturing an organic light emitting display, comprising:

forming a cathode line on a substrate;

forming a plurality of anode electrodes on the substrate, the anode electrodes being insulated from the cathode line;

forming an insulating layer having a first opening exposing a portion of the cathode line and a plurality of second openings, each of the second openings exposing a portion of a corresponding one of the anode electrodes, the insulating layer covering a portion of the cathode line;

forming a first common layer on the portion of the each of the anode electrodes exposed by the second opening and the portion of the cathode line exposed by the first opening;

forming an organic light emitting layer in an area of the first common layer corresponding to the second openings;

forming a second common layer on the first common layer and the organic light emitting layer;

forming an electrical connection portion electrically connected to the cathode line by supplying a conductive solution that dissolves the first common layer and the second common layer to an area of the second common layer corresponding to the first opening; and forming a cathode electrode overlapping with the second common layer and the electrical connection portion, wherein the second openings are arranged in a matrix shape in a plan view of the organic light emitting display.

8. The method of claim 7, wherein the forming of the electrical connection portion comprises:

supplying the conductive solution to the area of the second common layer corresponding to the first opening; and drying a solvent contained in the conductive solution.

9. The method of claim 7, wherein the conductive solution comprises at least one of acetone, toluene, sodium hydroxide, potassium hydroxide, hydrogen fluoride, or phosphoric acid as a solvent thereof.

10. The method of claim 7, wherein the conductive solution comprises at least one of silver, copper, carbon nano-tube, or conductive polymer material as a solute thereof.

11. The method of claim 7, wherein the cathode line is disposed between two anode electrodes of the anode electrodes, the two anode electrodes being adjacent to each other.

\* \* \* \* \*